United States Patent
Moody et al.

(10) Patent No.: US 6,232,768 B1
(45) Date of Patent: *May 15, 2001

(54) CENTERING A SIGNAL WITHIN THE DYNAMIC RANGE OF A PEAK DETECTING PROXIMITY DETECTOR

(75) Inventors: Kristann L. Moody, Barrington; Ravi Vig, Bow; P. Karl Scheller, Rochester; Jay M. Towne, Newbury; Teri L. Tu, Bow, all of NH (US)

(73) Assignee: Allegro Microsystems Inc., Worcester, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/852,856

(22) Filed: May 7, 1997

Related U.S. Application Data

(63) Continuation-in-part of application No. 08/587,406, filed on Jan. 17, 1996, now Pat. No. 5,694,038.

(51) Int. Cl.[7] .............................. G01B 7/30; G01P 3/489; F02P 17/02; H03G 3/20
(52) U.S. Cl. ................. 324/207.12; 324/166; 324/207.2; 324/251; 327/74; 327/306; 327/511; 123/146.5 A; 330/279
(58) Field of Search .......................... 324/207.12, 207.2, 324/207.25, 207.26, 251, 252, 166, 173, 174, 103 P, 225, 239, 207.21; 327/306, 307, 331, 332, 510, 511, 60, 72, 74, 179; 307/116, 117; 330/96, 278, 279; 123/146.5 A, 612, 617

(56) References Cited

U.S. PATENT DOCUMENTS

| | | | |
|---|---|---|---|
| 4,185,265 | 1/1980 | Griffin et al. | 340/32 |
| 4,293,814 | 10/1981 | Boyer | 324/166 |
| 5,493,219 | 2/1996 | Makino et al. | 324/207.25 |
| 5,694,038 | * 12/1997 | Moody et al. | 324/207.2 |
| 5,729,127 | * 3/1998 | Tamura et al. | 324/174 |
| 5,821,745 | * 10/1998 | Makino et al. | 324/166 X |
| 5,917,320 | * 6/1999 | Scheller et al. | 324/166 |
| 5,952,824 | * 9/1999 | Shinjo et al. | 324/166 X |

* cited by examiner

Primary Examiner—Gerard Strecker

(57) ABSTRACT

A magnetic-field-to-voltage transducer includes a Hall element and a digitally gain-controlled Hall-voltage amplifier that produces an analog voltage Vsig having excursions of one polarity corresponding to the passing of magnetic articles. Vsig is applied to the input of a peak-referenced-threshold signal detector that generates a binary proximity-detector output voltage, Vout, having transitions of one direction upon approaches of gear teeth down to zero speed. A digitally gain-controlled amplifier is connected to the Hall element. A comparator circuit generates a binary signal Vbig (or $V_{toobig}$) that changes from one to another binary level each time that Vsig exceeds a DC target voltage, $V_{TG}$. The AGC circuit incrementally changes the transducer gain in the direction to bring the peaks in Vsig to just below the target value $T_{TG}$. Reference voltages $V_{P2}$ and $V_{N2}$ are generated that are equal respectively to the most recent peak positive and negative going excursion in Vsig. DC off-set-limit voltages $V_A$ and $V_B$ are provided that are respectively above and below the center of the dynamic voltage range of the detector, and the entire signal Vsig at the output of the amplifier is biased in a negative direction when the median value, Vos, of Vsig is greater than $V_A$ and moving the entire signal Vsig in a less positive direction when Vos is less than $V_B$ to keep Vos within the range from $V_B$ to $V_A$.

7 Claims, 5 Drawing Sheets

CENTERING A SIGNAL WITHIN THE DYNAMIC RANGE OF A PEAK DETECTING PROXIMITY DETECTOR

REFERENCE TO RELATED PATENT APPLICATIONS

This is a continuation in part of application Ser No. 08/587,406, filed Jan. 17, 1996 now U.S. Pat. No. 5,694,038 issued Dec. 2, 1997.

BACKGROUND

This invention relates to a peak-referenced-threshold detecting type proximity detector, and especially to a ferrous-gear-tooth transducer including a Hall element and a Hall voltage amplifier, and more particularly relates to such a transducer in which the transducer output voltage signal peaks are automatically centered within the dynamic range of the detector.

The term "magnetic article" as used herein applies to magnetized bodies, ferrous bodies and other bodies having a low magnetic reluctance that tend to alter the ambient magnetic field.

In the patent U.S. Pat. No. 5,442,283, issued Aug. 15, 1995 there is described an integrated circuit Hall-voltage proximity-detector, which employs a Hall-signal peak-referenced-threshold detector. The integrated circuit chip is mounted to a pole of a magnet. A peak-referenced-threshold type of signal detector tracks a slope of a Hall voltage (e.g. corresponding to the approach of a passing gear tooth) and briefly holds the ensuing peak voltage before producing an output signal indicating the onset of the following Hall-voltage slope of opposite direction (e.g. corresponding to the approach of a valley between two gear teeth).

In this patent, the Hall voltage holding circuit includes a capacitor and a circuit means for controllably leaking charge out of or into the capacitor for preventing false tripping of a comparator that provides the transition in the binary output signal. The holding voltage of the capacitor thus has a droop which leads to increasing loss of holding accuracy as the speed of gear tooth passage becomes slower, and therefore the detector has a minimum gear teeth speed at which accurate detection is possible. A capacitor used in the engine compartment of an automobile is typically required to operate over the temperature range of −40° C. to 170° C.

When a peak-referenced-threshold detector of the kind described in the patent U.S. Pat. No. 5,442,283, is so used, the associated peak holding capacitor must have a very high leakage resistance to prevent missing the correct cylinder-firing times at start-up (crank start). Even use of such an expensive capacitor would cause the missing of the first one or two firing times.

Most proximity detectors of the prior art produce a high binary output voltage indicating approach and proximity of a passing article, and produce a low binary voltage when the article recedes from the detector. The signal detector is conventionally of a type that may be called the mid-signal referenced threshold detector, or just the mid-signal detector type, wherein the transition in detector output voltage from low to high typically is triggered by a comparator that determines when the transducer voltage rises to (or falls from) a fixed internal threshold voltage referenced to a voltage level corresponding to the median or average value of the Hall signal.

Alternatively, in the case of the peak-referenced-threshold detector in the above-described patent, the detector output transition occurs when a transducer voltage peak has just occurred and the transducer signal voltage has dropped by an amount equal to a predetermined threshold voltage from the peak value.

Proximity detectors having fixed threshold voltages, produce low to high (or high to low) binary transitions in the output signal indicating approach of a magnetic article. In practice, the closest passing distance (sometimes referred to as the air gap) does not remain constant.

Variations of the air gap dimension causes shifts in the actual distances of article approach and receding at which the transducer voltages exceeds or falls below the fixed thresholds. This results in a lack of accuracy of passing detection that may rule out their use as position detectors of passing articles such as cams and gear teeth.

Changes in the air gap, between passing articles to be detected and the transducer, may be attributable to mechanical and electrical properties of the detector as well as in the properties of the passing articles, especially as a function of temperature.

Other causes of inaccuracy stem from the fact that the amplitude of the Hall voltage changes when gear teeth (magnetic articles) have different ferro-magnetic properties from tooth to tooth, and/or when A undulating changes in the spacings (air gap) of gear teeth to detector are caused by eccentricity of the gear. Also, changes in temperature cause changes in air gap dimensions and in the sensitivity of the transducer and transducer-voltage amplifier.

Whether detection is accomplished by sensing the Hall voltage peaks or using a voltage threshold criteria for indicating approach of a passing article, changes in the median amplitude of the transducer voltage degrade the accuracy of position detection because the Hall signal is not centered within the dynamic range of the Hall signal detector.

It is an object of this invention to provide a proximity detector having a magnetic-field-to-voltage transducer and providing automatic centering of the transducer output voltage within the dynamic range of the transducer-signal detector.

It is a further object of this invention to combine automatic gain control with the automatic centering of transducer output voltage within the dynamic range of a capacitor-less transducer-signal detector of the peak-referenced-threshold type, to provide great accuracy of detection down to zero speed.

SUMMARY OF THE INVENTION

A proximity-detection method for detection of passing magnetic articles includes sensing the ambient magnetic field, generating a voltage, $V_H$, having an amplitude that is directly related to the magnetic field, and applying $V_H$ to the input of an amplifier to produce at an output thereof an amplified voltage, Vsig. There is then provided a signal detector to which Vsig is applied, which detector produces a binary proximity-detector output voltage Vout having transitions of one polarity each time excursions of one polarity in Vsig reach a predetermined point therein. Sources are provided of DC off-set-limit voltages $V_A$ and $V_B$, corresponding to the positive and negative limits of the dynamic range of the detector.

When at the output of the amplifier the median voltage, Vos, of Vsig is greater than $V_A$, the entire signal Vsig is moved in a negative direction, and when the median value, Vos, of Vsig is less than $V_B$ the entire signal Vsig is moved in a positive direction to keep Vos within the dynamic range of the detector, namely from $V_B$ to $V_A$.

The median voltage Vos may be produced by continuously generating one reference voltage $V_{P2}$ that is equal to the most recent peak positive going excursion in Vsig, by continuously generating another reference voltage $V_{N2}$ that is equal to the most recent peak negative going excursion in Vsig, and by generating the median voltage, Vos, at within about ten percent of the center of the voltage range between $V_{P2}$ and $V_{N2}$.

In yet another way, the moving of the signal Vsig may be accomplished by counting the transitions of at least one polarity in Vout during intervals when Vos is greater than $V_A$ and generating a digital signal for adding to Vsig a negative compensating off-set bias voltage by one predetermined negative bias increment at each transition of the one polarity in Vout, and by counting the transitions of the at least one polarity in Vout during intervals when Vos is less than $V_B$ and generating a digital signal for adding to Vsig a positive compensating off-set bias voltage by one predetermined positive bias increment at each transition of the one polarity in Vout.

The method of this invention may also include an automatic gain control (AGC) feature whereby the amplifier is a digitally gain-controlled amplifier, and there are added the additional steps of comparing the amplitudes of the excursions of at least one polarity in Vsig to a predetermined target value, $V_{TG}$; generating a binary signal Vbig that changes from one to another binary level each time that Vsig exceeds the target value, applying the binary signal Vbig to the digitally-gain-controlled amplifier and when Vbig changes from the one to another binary level changing the gain of the digitally-gain-controlled amplifier by one predetermined gain increment in the direction to bring the peak values in Vsig to just below the predetermined target value. Finally, there is generated a binary proximity-detector output voltage Vout having transitions of one polarity each time excursions of one polarity in Vsig reach a predetermined point therein.

When in this invention the AGC feature is included, changing of the amplifier gain includes clocking the incremental changes in gain by transitions in Vout, whereby the speed at which gain may be changed is directly related to the rate at which magnetic articles are passing. This advantageously limits the rate at which adjustments in gain can be made, and assures a speed of gain change less than that which would lead to large changes in the point in successive excursions in Vsig at which proximity detection is effected. In other words, there will be less "jitter" in the timing of transitions in the binary output signal Vout from the detector.

Likewise, the automatic off-set adjustment feature of this invention may include clocking incremental changes in gain at transitions in Vout, whereby the off-set adjustment rate changes only incrementally at each transition in Vout so that changes in the point in successive excursions in Vsig at which proximity detection is effected is again kept small. The result is even greater proximity detection accuracy and less jitter in the transitions in the detector output signal. It is preferred that the signal detector is a peak-referenced-threshold detector that holds the peaks of at least one polarity until the signal retreats from each peak by a predetermined threshold voltage value that defines the predetermined point in Vsig.

The automatic offset control feature of this invention makes it possible to provide a maximally large Hall signal just within the dynamic range of the Hall-signal detector which leads to unparalleled accuracy in proximity-detector accuracy, even at magnetic article speeds down to zero.

BRIEF DESCRIPTION OF THE DRAWINGS

FIG. 3 shows a partial waveform of the output voltage signal $V_{N1}$ from the NDAC1 in FIG. 1.

FIG. 4 shows a waveform of output voltage, Vout, of the proximity-detector of FIG. 1.

FIG. 5 shows a waveform of the reset signal to the counter 17 in the proximity-detector of FIG. 1.

FIG. 6 shows a waveform of the reset signal to the counter 27 in the proximity-detector of FIG. 1.

FIG. 7 shows a waveform of the latch enable signal to the N latch 52 in the proximity-detector of FIG. 1.

FIG. 8 shows a waveform of the latch enable signal to the P latch 42 in the proximity-detector of FIG. 1.

FIG. 10 shows a corresponding waveform of output voltage, Vout, of the proximity-detector of FIG. 1.

FIG. 11 shows a corresponding output signal waveform of comparator 62, $V_{toobig}$, in the proximity-detector of FIG. 1.

FIG. 12 shows corresponding waveforms of the binary output voltages from the first two bits in gain counter (G-COUNTER) 85 of the proximity-detector of FIG. 1.

DESCRIPTION OF PREFERRED EMBODIMENTS

Figure 1:
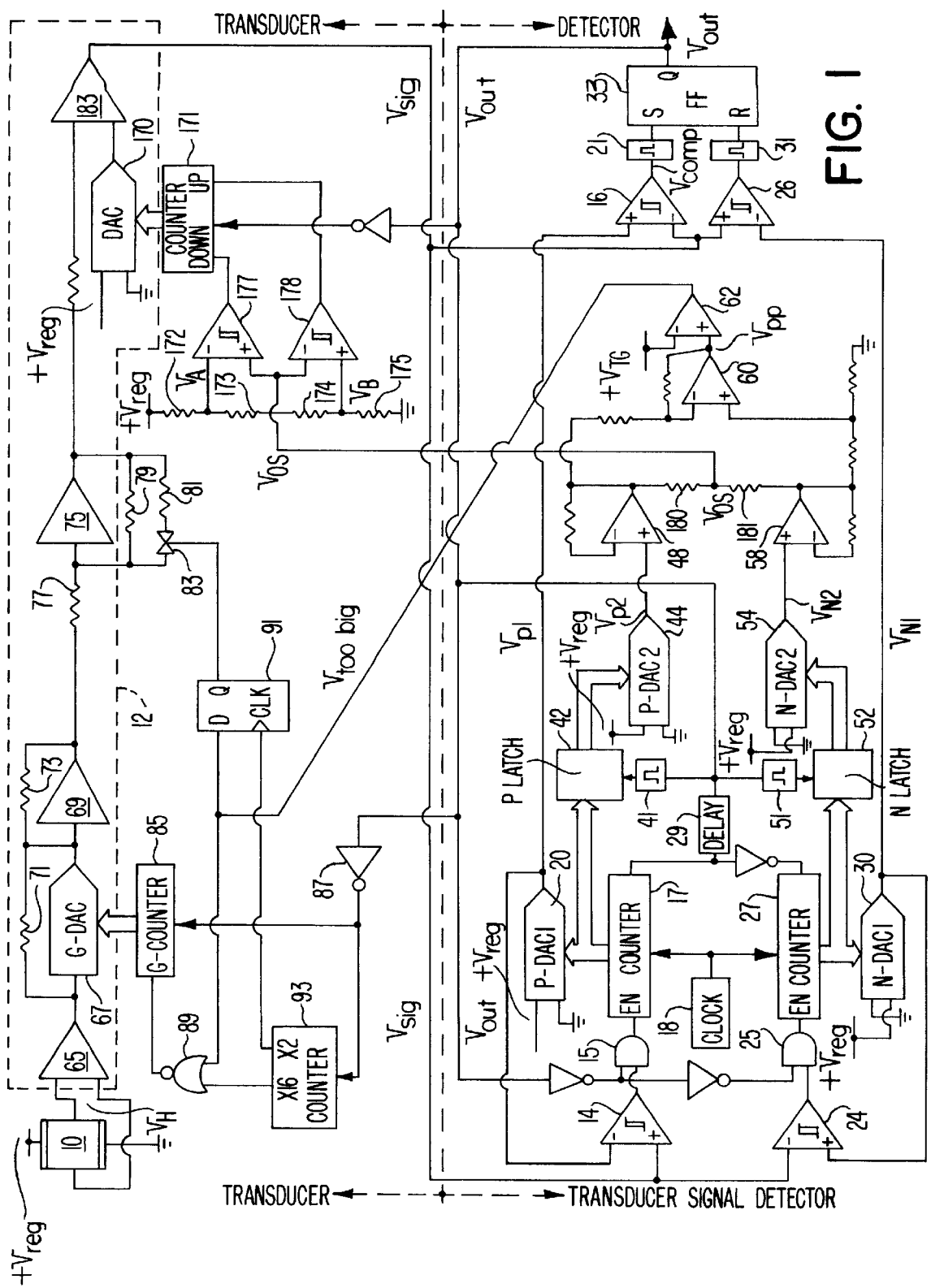
FIG. 1 shows a block diagram of a magnetic-article proximity detector of this invention.

The Hall element 10 of FIG. 1 has an output connected to the input of a Hall voltage amplifier 12. Hall element 10 may be mounted at a pole of a magnet (not shown), so that when a ferrous article approaches, the Hall voltage $V_H$ and thus the amplified Hall voltage Vsig increase (or decrease). When the article recedes, $V_H$ and Vsig decrease (or increase depending upon the polarity of the magnet pole). Alternatively, the detector circuit of FIG. 1 may be used to detect magnetic articles that themselves are magnetized, in which case the Hall element need not be mounted with a magnet.

A magneto resistors bridge (not shown) may be substituted for the Hall element. And two Hall elements with their outputs connected differentially to the input of the Hall voltage amplifier (not shown) represents a second alternative magnetic-field-to-voltage transducer.

The amplified Hall voltage, Vsig, is manipulated by the remaining circuits in the proximity detector of FIG. 1 to produce a square wave proximity-detector output signal, Vout, that like a shadow graph reflects the profile of the passing articles.

The amplified Hall voltage Vsig is applied to the positive input of a first comparator 14 and is also applied to the minus input of a second comparator 16. The amplified Hall voltage Vsig is further applied to the negative input of the other first comparator 24 and to the plus input of the other second comparator 26.

Assuming, as a starting point, that the counter 17 is at zero count, when the output of the first comparator 14 goes high the counter 17 begins counting the clock pulses from clock 18. The resulting count is presented to the digital-to-analog converter (PDAC1) 20 which produces an output analog voltage $V_{P1}$ always lying somewhere within the range from zero to the DC supply voltage, +Vreg. At any instant the amplitude of $V_{P1}$ is a direct linear function of the count signal from counter 17. When power is first applied to the detector circuit, a logic block (not shown) senses the time of turning on of the DC supply voltage, +Vreg, and resets the counters to zero count.

Figure 2:
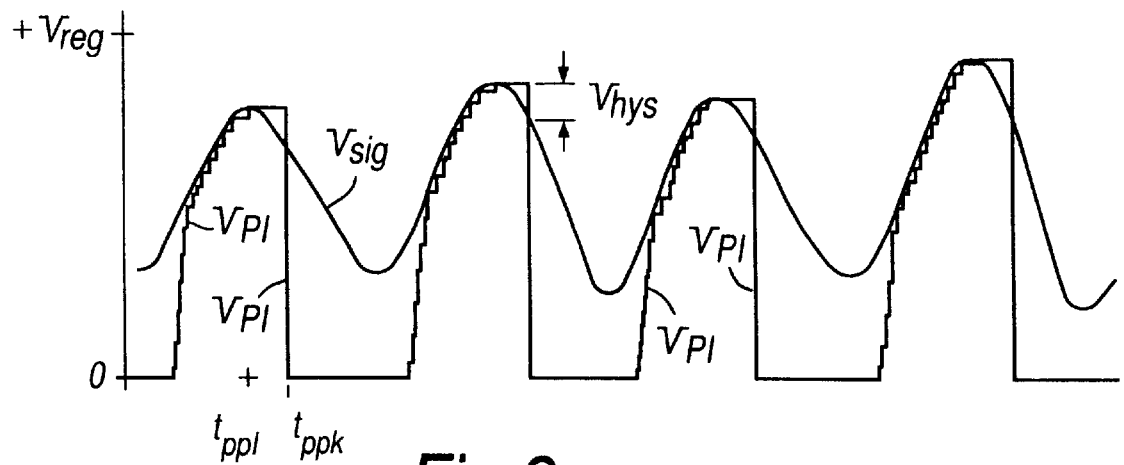
FIG. 2 shows a waveform of the Hall (transducer) voltage signal, during passage of four magnetic articles, superimposed on a waveform of the output voltage signal $V_{P1}$ from the PDAC1.

The comparator 14 has hysteresis and so is a Schmitt type comparator. The output of the DAC 20 (PDAC1) is connected to the negative input of the comparator 14 so that whenever Vsig becomes greater than voltage $V_{P1}$ plus the small hysteresis threshold voltage of the comparator 14, then the comparator 14 output goes high. If at that time Vout is low, then the output of AND gate 15 goes high and the counter 17 is enabled and counting. When Vsig is growing more positive, $V_{P1}$ is caused to track Vsig in stair step fashion, as is illustrated in FIG. 2. The incremental vertical excursions of the stair stepped $V_{P1}$ are equal to $Vreg/2^n$, where n is the number of DAC bits. The incremental horizontal times, $\Delta t1$, increase as the slope of Vsig decreases.

Figure 4:

As is illustrated in FIG. 2, when a peak positive voltage of Vsig is reached, the counter 17 stops counting at a time $t_{pp1}$, and $V_{P1}$, holds this peak voltage until time $t_{ppk}$. At time $t_{ppk}$, Vsig falls below the held voltage $V_{P1}$ by an amount Vhys equal to the threshold of comparator 16, and the output of comparator 16 goes high briefly setting the flip flop 33 so that Vout goes from low to high, as seen in FIG. 4.

Figure 5:
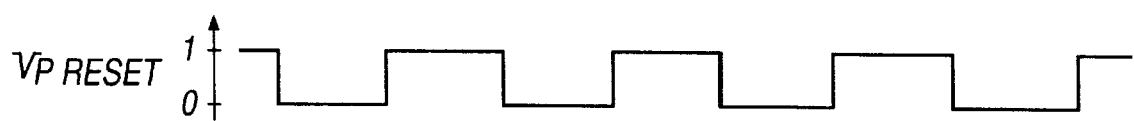
Figure 6:
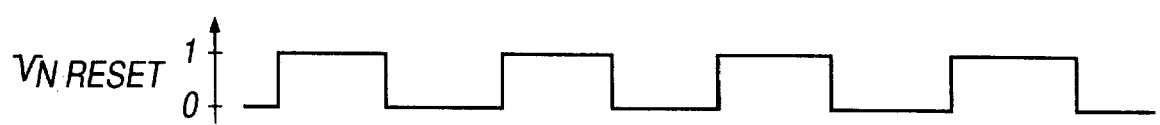

Vout is applied to the reset input of the counter 17 via a delay circuit 29, resetting and holding the count in counter 17 to zero at time $t_{ppk}$ (FIG. 5) for as long as the reset signal $V_{Preset}$ is high; thus $V_{P1}$ remains at zero volts for that time also. At a subsequent positive pulse in the signal Vsig, $V_{P1}$ again begins to track the subsequent positive pulse to its peak and to hold that new peak voltage. The reset signal (FIG. 6) resets the counter 27 at times $t_{npk}$ and holds its reset for as long as the reset signal $V_{Nreset}$ is high.

A lower (N) circuit portion in the proximity detector of FIG. 1 essentially mirrors the construction of the upper (P) portion just described. The lower circuit portion manipulates the negative pulses in Vsig in the same way as does the upper portion with respect to positive pulses in Vsig.

Figure 3:
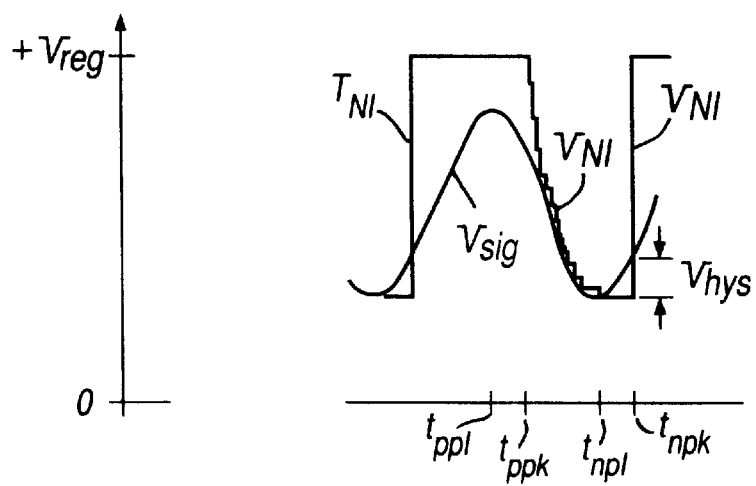
FIGS. 3, 4, 5, 6, 7 and 8 are drawn to the same time scale as that of FIG. 2.

For example, as is illustrated in FIG. 3, when a peak negative voltage of Vsig is reached, the counter 27 stops counting at a time $t_{np1}$, and $V_{N1}$ holds this peak voltage until time $t_{npk}$. At time $t_{npk}$, Vsig falls below the held voltage $V_{N1}$ by an amount Vhys equal to the threshold of comparator 26, and the output of comparator 26 goes high to reset the flip flop 33 so that Vout goes from high to low, as seen in FIG. 4. The pulse expander circuits 21 and 31 shown as one-shot pulse generators in FIG. 1 have their inputs respectively connected to the outputs of comparators 16 and 26 and have their outputs respectively connected to the set and reset inputs of flip flop 33.

The part of the proximity detector of FIG. 1 described above operates in a peak-referenced-threshold detecting mode. Such a detector is the subject of a patent application, Ser. No. 08/587,405, entitled DETECTION OF PASSING MAGNETIC ARTICLES AT SPEEDS DOWN TO ZERO, now U.S. Pat. No. 5,729,130, that is assigned to the same assignee as is the current application and was filed concurrently herewith. That application describes the proximity detector circuit and operation in greater detail and is incorporated by reference herein.

The remainder of the circuit in FIG. 1 relates to circuitry for the automatic gain control circuit of the Hall voltage.

Figure 7:
Figure 8:

The count signals from counters 17 and 27 are also applied, via latches 42 and 52 respectively to PDAC2 44 and NDAC2 54. The P-latch 42 and N-latch 52 are enabled by signals $V_{Platch}$ (FIG. 7) and $V_{Nlatch}$ (FIG. 8) from one shot generators 41 and 51 respectively.

Figure 9:
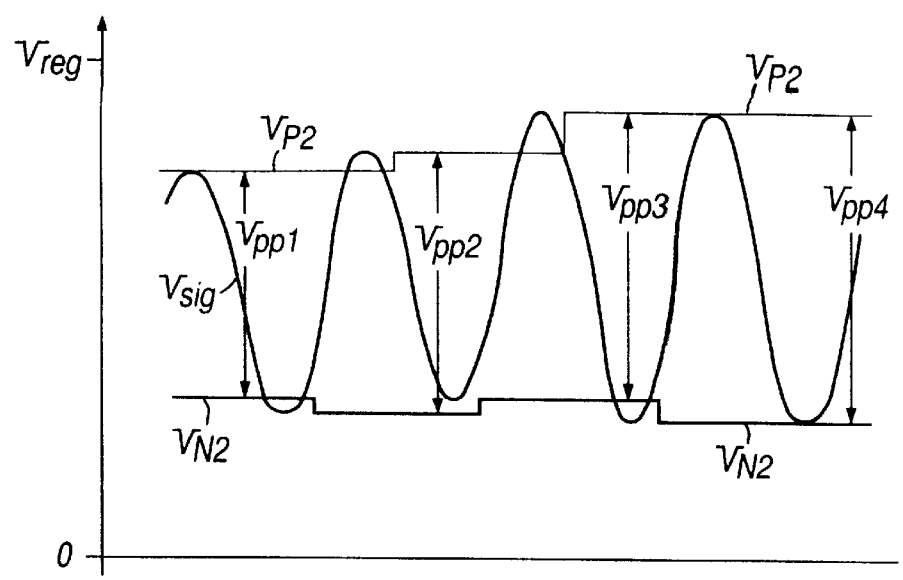
FIG. 9 shows a waveform of the Hall (transducer) voltage signal, during passage of a few magnetic articles, having superimposed thereon the corresponding output signals $V_{P2}$ and $V_{N2}$ from PDAC2 and NDAC2 in the proximity detector of FIG. 1.
Figure 10:
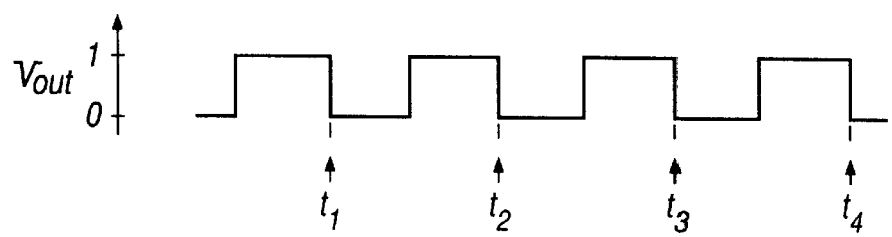
FIGS. 10, 11 and 12 are drawn to the same time scale as that of FIG. 9.

The one shot generators 41 and 51 are triggered respectively by a low to high transition in the signal Vout and by a high to low transition in Vout (FIG. 4). The output signals $V_{P2}$ and $V_{N2}$ from PDAC2 and NDAC2 are shown in FIG. 9 as they relate to each other and to Vsig, and Vout is drawn to the same scale in FIG. 10.

Now to recapitulate, the output of comparators 24 and 26 go high only when Vsig goes negative. Thus only when Vsig is going negative are there changes of state in the signals of AND gate 25, counter 27, NDAC1 30, latch 52, NDAC2 54 and buffer 58. The upper (P) and lower (N) portions of the circuit share the clock 18 and the reset delay circuit 29. Referring to FIG. 3, this tracking of Vsig begins at a time $t_{ppk}$ at which a low to high transition in Vout occurs.

Counters 17 and 27 only count upwardly. It should be noted that the DC reference voltages +Vreg and ground are connected to NDAC1 30 and NDAC2 54 inversely with respect to those connections to PDAC1 20 and PDAC2 44; therefore as the count in counter 27 goes up, the output $V_{N1}$ of the NDAC1 30 goes down as seen in FIG. 3. But, both of the NDACS 30 and 54 could have been connected to the DC reference voltages as are the PDACs 20 and 44 if the counter 27 had been of the kind that counts down from maximum count. The counters 17 and 27 are of the kind that include an anti-overflow feature that prevents wrapping of the count when maximum count is exceeded.

The signals $V_{P2}$ and $V_{N2}$ are applied via buffer stages 48 and 58 to the two inputs of a fixed-gain differential amplifier 60. The output signal of amplifier 60, Vpp, is the difference voltage between $V_{P2}$ and $V_{N2}$, which difference voltage is essentially equal to the peak to peak value of Vsig. As Vsig grows, it is tracked by Vpp as seen in FIG. 9.

The signal Vpp is applied to one input of a comparator 62. A reference voltage $V_{TG}$ is applied to the other comparator 62 input. When Vpp exceeds $V_{TG}$ the output signal $V_{toobig}$ of comparator 62 is at a high binary level. When Vpp is less than $V_{TG}$, $V_{toobig}$ is at a low binary level.

The Hall-voltage ($V_H$) amplifier 12 includes a fixed-gain amplifier stage 65; a programmable-gain amplifier composed of a digital-to-analog converter G-DAC 67, two resistors 71 and 73, and an operational amplifier 69; a step-wise adjustable-gain amplifier composed of an operational amplifier 75, three resistors 77, 79 and 81, and a switch 83; and an automatic off-set adjust circuit including a voltage-divider connected DAC 170, an up-down counter 171, a voltage-divider network composed of resistors 172, 173, 174 and 175, two Schmitt comparators 177 and 178, a voltage divider composed of resistors 180 and 181, and a differential amplifier 183.

A counter 85 is an up counter which does not wrap after the maximum count is reached, and has a count output connected to the G-DAC 67. The signal Vout is inverted by invertor 87, and counter 85 counts positive transitions in the inverted signal Vout. G-DAC 67 is connected internally as a digitally programmable resistor having a maximum resistance when the input count to the DAC is zero.

The resistor 71 in parallel with the resistance of G-DAC 67 sets the total input resistance to the operational amplifier 69 at its highest value at zero count which sets the gain of the amplifier at its lowest value.

Figure 11:
Figure 12:
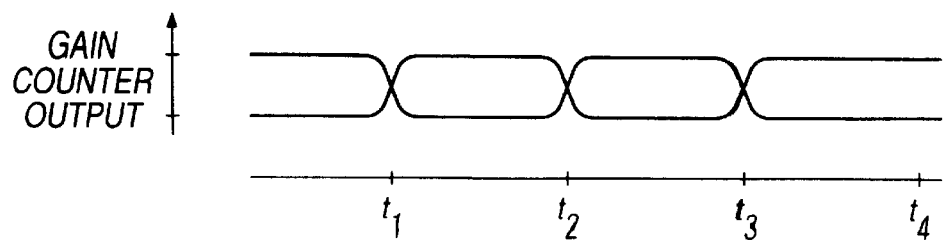

When the first positive and negative excursions in Vsig generate a signal Vpp1 (FIG. 9) that is lower than the reference voltage $V_{TG}$, the signal $V_{toobig}$ is low (FIG. 11) and enables counter 85 via inverting NOR gate 89. Counter 85 responds by counting up by one count at the next positive transition in inverted signal Vout as indicated in FIG. 12. This causes a single increment of gain increase, which is illustrated in FIG. 9 wherein Vpp1 grows to Vpp2 and Vsig increases slightly in amplitude in the period from $t_1$ to $t_2$.

This process of testing the amplitude of (Vpp and thus Vsig) against a target reference value $V_{TG}$ and adjusting the gain upward one increment when the target has not yet been reached, continues for as many periods in Vsig (and Vout) as is necessary to set the peak to peak amplitude of Vsig to the target value, $V_{TG}$.

When the target value has been reached or exceeded, $V_{toobig}$ goes high (FIG. 11), so the counter 85 being thus disabled does not count further as illustrated in FIG. 12 and the gain of the amplifier remains fixed (e.g. between times $t_3$ and $t_4$ in FIG. 9) thereafter (until the detector has been turned off and started up again).

However, when the first positive and negative excursions in Vsig generate a signal Vpp1 (FIG. 9) that is higher than the reference voltage $V_{TG}$, the signal $V_{toobig}$ is high for disabling counter 85 via inverting NOR gate 89, and holding the D input of the flip flop 91 high.

Counter 93 is a serial counter that provides one output at which the signal is low until the counter has counted two (more generally a few) positive excursions in the inverted signal Vout, at which time the invertor 87 output goes high and clocks through the high at the D input of flip flop 91 to the flip flop Q output.

This clocking of a high signal through flip flop 91 occurs when the non inverted signal Vout (FIG. 10) goes low. After the first two periods in Vsig, switch 83 closes to connect feedback resistor 81 which decreases the gain of the amplifier composed of operational amplifier 85 and resistors 77 and 79. For example, the operational amplifier gain may be reduced by a factor of 4, causing the gain of amplifier 12 to be reduced by a factor of 4.

Thus during the first two positive pulses in the transducer voltage Vsig it is determined whether the peak to peak voltage of Vsig ($V_{pp}$) is too big relative to the target reference voltage $V_{TG}$. If it is not too big, the G-counter is enabled (by signal $V_{toobig}$) the resistance of G-DAC 67 immediately begins to fall and the gain of that count-controllable gain stage rises to the target value at which it remains thereafter.

But if during the first two positive pulses in the transducer voltage Vsig (corresponding to the passing of two magnetic articles), it is determined that the peak to peak voltage ($V_{pp}$) of Vsig is too big relative to the target reference voltage $V_{TG}$, then after two pulses in Vsig the overall gain of amplifier 12 is reduced by a factor of 4, and the count-controllable gain stage brings the peak to peak value of Vsig up to the target value.

Counter 93 is a serial up-counter of the kind that does not wrap. It counts up only and is not reset until de-energized and again energized. Counter 93 provides a second serial count output that goes high at the larger count of 16 excursions (pulses) in Vsig (or Vout). The x16 output is low until the count 16 has been reached. A high output signal from the x16 output of counter 93 at the count of 16 disables the G-counter 85 to limit how many (e.g. 16) periods in Vsig (e.g. negative going excursions in Vsig and/or Vout) may be counted by the G-counter 85 to adjust the gain. Alternatively, the counting of positive going excursions would be equally effective.

The purpose of effecting automatic gain adjustment, for only a few of the first pulses in Vsig following turning on the supply voltage +Vreg and starting the detection of passing articles, is to obtain optimum transducer-voltage amplifier gain for the conditions at starting and to maintain constant gain thereafter in order to avoid incremental shifts in the actual distance of approaching articles at which a corresponding transition in Vout occurs. When gain changes take place continuously frequent shifts in detection approach distance cause jitter in the Vout transitions.

In the above described embodiment, the gain of amplifier 12 is adjusted during the first 16 periods in Vsig (corresponding to the passage of the first 16 magnetic articles) and thereafter held fixed, providing a fast initial gain adjustment after which no further adjustments are made.

This feature is particularly suitable in a proximity detector for use in a combustion engine ignition system, wherein all the adjustments in gain occur only during crank start of the engine. During the subsequent loading and running of the engine it is desired to avoid any changes in ignition timing that would occur as a result of changes in the amplitude of Vsig, and thus gain adjust is completed just at start.

To summarize, after just two articles have passed it is determined whether the signal is too big and if so the gain of amplifier 12 is reduced by a large factor, namely in this example by a factor of 4. And during passage of the following 16 articles, the gain is adjusted upward based upon the greatest of the peak amplitudes in the transducer signal $V_H$, so that greatest peak amplitude is at a predetermined target value.

This target amplitude is just inside the dynamic range of the amplifier 12, avoiding clipping of the signal while at the same time providing a large signal Vsig with peaks just under the target value $V_{TG}$ for enhancing accurate detection.

Figure 13:
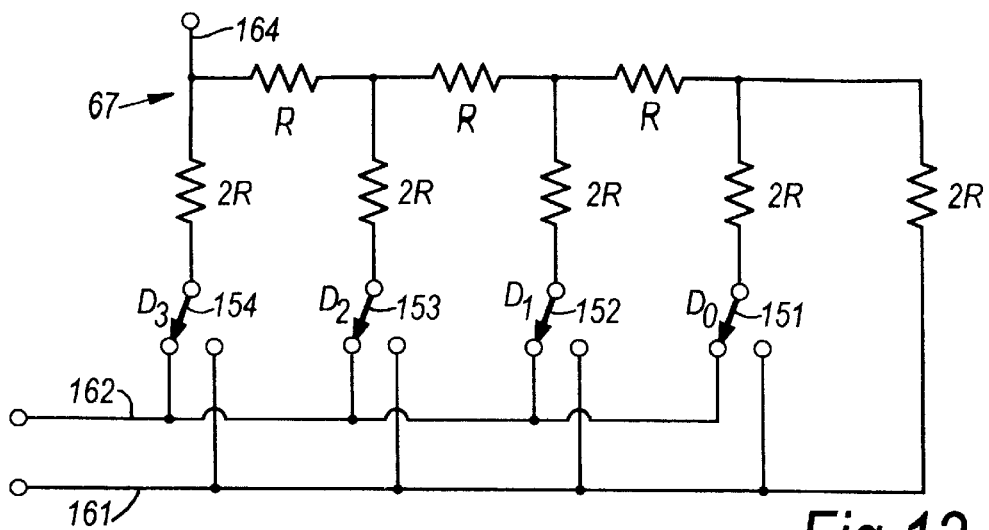
FIG. 13 shows a circuit diagram of an R/2R digital-to-analog converter (DAC).
Figure 14:
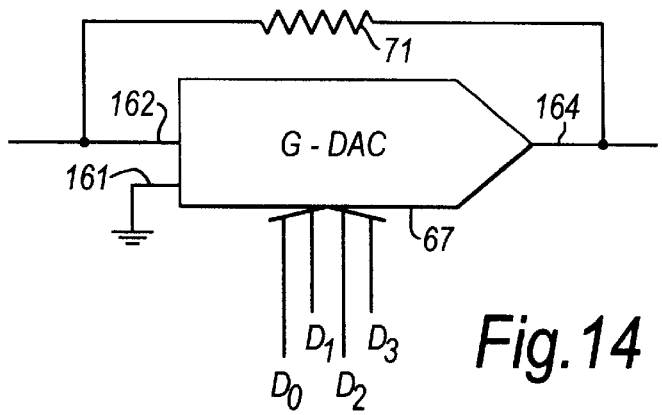
FIG. 14 shows a block diagram 67 of the DAC of Figure connected as a digitally controllable resistor, such as may be employed as the G-DAC 85 in FIG. 1.

The DAC 67 serves essentially as A digitally-controllable resistor, and may employ the well known 2R/R type DACs connected as shown in FIG. 13. Each of the three resistors shown at the top of FIG. 13 have a resistance R, while the other four resistors have a resistance of 2R. The corresponding external leads of DAC 67 are shown both in the full circuit of FIG. 13 and the block diagrammed DAC 67 in FIG. 14.

A lead 161 is grounded while leads 162 and 164 are connected respectively to the output of the first Hall-voltage amplifier 65 and to the input of the operational amplifier 69. The four switches 151, 152, 153 and 154 represent electronic switches to which are connected the four digit count signal $D_0$, $D_1$, $D_2$ and $D_3$ from the gain counter (e.g. 85). Switches 151, 152, 153 and 154 are shown in the positions wherein all four digits in the input count signal are high and the resistance between leads 162 and 164 is at a minimum value. The paralleling resistor 71 is not essential. Resistor 71 drops the minimum resistance of the paralleled combination at the input of the operational amplifier but more importantly reduces the maximum operational amplifier input resistance, i.e. maximum $R_{in}$.

When grounded the G-DAC 67 becomes a digitally-controllable voltage divider, and the effective resistance between conductors 162 and 164 becomes essentially a linear function of the digital count to the G-DAC 67 when R is large enough that the resistance between terminals 161 and 162 is much larger than the output impedance of the Hall-voltage amplifier 65. Thus amplifier gain is a linear function of the count.

Operation of the automatic off-set adjust circuits is as follows.

The voltage divider resistors 180 and 181 are connected across the outputs of buffer amplifiers 48 and 58. Resistors 180 and 181 may have equal values so that the voltage Vos at the center of the voltage divider is midway between the held peak voltages of Vsig, namely $V_{P2}$ and $V_{N2}$.

The voltages $V_A$ and $V_B$ developed by divider resistors 172, 173, 174 and 175 may be equidistant from Vreg/2, e.g. when Vreg is 3 volts, $V_A$ may be 2.0 volts and $V_B$ is then 1.0 volt. Moreover, it is preferred that the voltage divider voltages $V_A$ and $V_B$ respectively be a middle value, Vm, plus and minus the amount corresponding to the one bit incremental voltage, $V_{Db}$, of the DAC 170. This provides the tightest tolerance achievable using that particular DAC 170 without hunting.

For example, if +Vreg is 3.0 volts, the DAC 170 is a four bit DAC, and Vm is Vreg/2, then the median value of Vsig will be allowed to deviate from the range Vos +/−0.18 volts, before automatic offset correction will be effected. And when $V_A$ and $V_B$ are set at the divider voltages to Vm +$V_{Db}$ and Vm −$V_{Db}$ respectively, the hysteresis of comparators 177 and 178 may be zero.

When enabled, counter 171 is clocked and counts negative excursions in Vout. For example, when Vos is greater than Vm +/−0.18 volts, then the output of comparator 177 goes high and counter 171 is enabled for counting downward, and likewise when Vos is less than Vm +/−0.18 volts the output of comparator 178 goes high and the counter 171 is enabled for counting upward. Thus, the mid-point voltage Vos in the signal Vsig is automatically kept within the range Vm +/−0.18 volts, which compensates for all off-sets in $V_H$ and those introduced by the components of the transducer-voltage amplifier 12. Alternatively, the range of automatically adjusted offset voltages at the output of DAC 170 may be centered at a voltage other than Vreg/2 to maximize the headroom in the amplifier 183.

Figure 15:
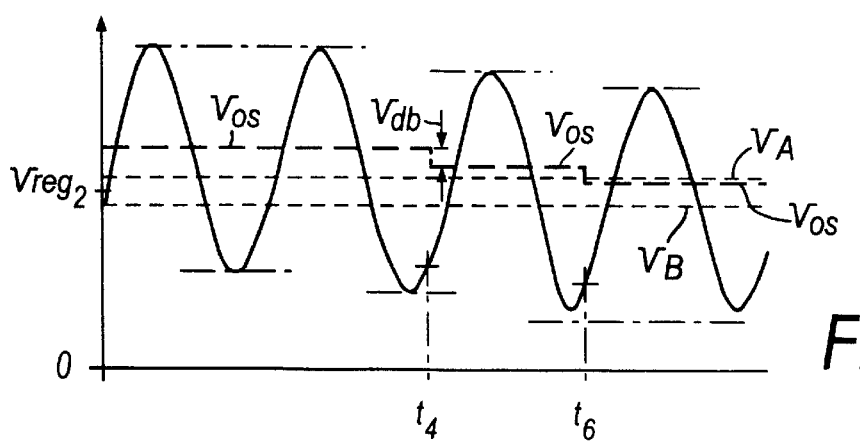
FIG. 15 shows a waveform of the Hall (transducer) voltage signal in the proximity detector of FIG. 1 with no AGC action, during passage of a few magnetic articles, having superimposed thereon the corresponding waveform of the offset level signal Vos.
Figure 16:
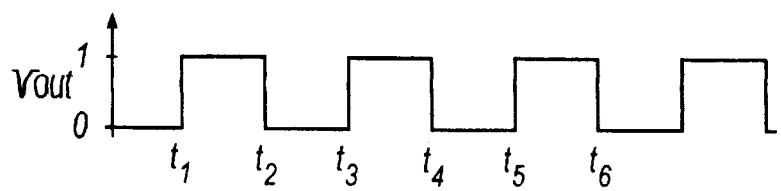
FIG. 16 shown the waveform of Vout drawn to the same time scale as the waveform Vsig and Vos in FIG. 15.

The waveforms of FIGS. 15 and 16 illustrate operation of the automatic offset feature without automatic gain control. The offset voltage, Vos, drops by the amount of one DAC bit (Vdb volts in DAC 171) at time $t_4$, which is the time at which the peak-threshold-referenced detector produces a negative-going transition in Vout that clocks counter 171.

The ultimate intention is to present to the input of the transducer-signal detector the signal Vsig at an "off-set" level that centers the signal Vsig within the dynamic range of the detector. To do so more precisely it may be necessary, e.g. to account for an unsymmetrical signal Vsig, to set Vm away from Vreg/2 and/or to set Vos away from the center of $V_{P2}$ and $V_{N2}$. These deviations from exact mid-points will in practice are not expected to exceed twenty five percent of the range from the mid-points of power supply, Vreg, or the peak to peak voltage, $V_{pp}$, of Vsig.

It has been found through computer generated models, that proximity detectors of the peak-referenced-threshold transducer-signal detector type, described in the above-mentioned patent application entitled DETECTION OF PASSING MAGNETIC ARTICLES AT SPEEDS DOWN TO ZERO, may advantageously merged with those of the mid-signal detecting type.

Such a detector is described in patent application Ser. No. 08/587,407, filed Jan. 17, 1996, entitled DETECTION OF PASSING MAGNETIC ARTICLES WHILE PERIODICALLY ADAPTING DETECTION THRESHOLDS TO CHANGING AMPLITUDES OF THE MAGNETIC FIELD, now U.S. Pat. No. 5,650,719, and assigned to the same assignee as is the present application.

A peak-referenced-threshold signal detector was advantageously merged in a computer modeling simulation with a mid-signal detector so that the peak-referenced-threshold signal detector, which is capable of operation down to zero speeds became operative in the peak-referenced-threshold mode for a short initial interval after starting, after which it automatically went into the mid-signal-threshold-referenced detection mode.

Furthermore the automatic gain control feature, that is capable of operation down to zero speeds, was incorporated with the slope-activated detector for only initially setting the gain and the level of Vsig. Automatic gain control was thereafter discontinued to avoid further step-function gain shifts which tend to cause jitter and instability in the detection distances of magnetic article approach and departure. The method of automatic gain control of this invention is especially well suited for such initial use in such a merged proximity detector because of its rapid gain adjustment and its undiminished detection efficacy at very low speeds.

Many variations in the proximity detectors of this invention are now evident, some of which are as follows.

It will be recognized that during the tracking by $V_{p1}$ of positive slope portions of Vsig by the proximity detector of FIG. 1, the comparator 14, clock 18, counter 17 and PDAC1 20 serve together as a generator of a digital signal, namely the digital count signal at the output of the counter 17, that is tracking Vsig. This digital signal generator is a digitizer of the analog signal Vsig, or is an analog-to-digital convertor.

Likewise during tracking by $V_{N1}$, comparator 24, clock 18, counter 27 and NDAC1 30 serve together as an analog-to-digital convertor producing a digital signal, namely the digital count signal at the output of the counter 27, that tracks negative going portions of Vsig.

In proximity detectors of this invention, digital-to-analog convertors may be formed by circuit means other than those shown here. For example, the digitally-gain-controllable amplifiers based upon use of G-DACs 67 may alternatively be based upon prior art digitally-gain-controlled amplifiers wherein there is substituted for the G-DAC a group of parallel connected branches, each containing a resistor and a binary-signal controllable switch.

It is further possible to employ just one up-down counter (instead of the up counters 17 and 27) that would count up and down in response to a high binary signal respectively from comparators 14 and 24. In this case only one DAC, e.g.

PDAC1 20, may be used with the output connected to the positive and negative inputs respectively of comparators 16 and 26. In this case it will be necessary to disable the comparator 16 when tracking a negative excursion in Vsig, and to disable comparator 26 when tracking a positive excursion in Vsig.

The circuit portion in FIG. 1 for generating the signal $V_{toobig}$ may then be modified by connecting the up-down counter output to both latches 42 and 52, and enabling these latches during up counting and down counting respectively, e.g. using the signal Vout as a latches enabling signal.

As noted, the purpose of effecting automatic gain adjustment, for only a few of the first pulses in Vsig is to avoid incremental shifts in the actual distance of approaching articles at which a corresponding transition in Vout occurs. In applications such as ignition distributors, the timing of engine firing tends to cause small but annoying jumps in engine power delivery. However, when detection accuracy is an overriding consideration, it is easily possible to periodically reset counter 93 (FIG. 1) to permit infrequent readjustments in gain, e.g. every minute or so, or after a predetermined number of detected articles have passed by.

Of course continuous gain adjustment is another option, e.g. accomplished in the detector of FIG. 1 by removing the NOR gate 89 and a connecting the Vtoobig signal directly to the enable input of the counter 85.

The Hall-amplifier output voltage Vsig may be considered a magnetic-field-to-voltage transducer output, which transducer includes the Hall element. The above-described AGC is effected by controlling the gain of a digitally controlled Hall-amplifier that may be considered part of a transducer. Alternatively, it is possible to digitally control the exciting current in the Hall element for effecting AGC of the composite transducer, e.g. by using a digitally controlled voltage regulator that is used for energizing the Hall element.

What is claimed is:

1. A proximity-detection method for detection of passing magnetic articles comprising:
    a) employing a magnetic-field-to-voltage transducer, sensing the ambient magnetic field, generating a voltage, $V_H$, having an amplitude that is directly related to the magnetic field, and applying $V_H$ to the input of an amplifier to produce at an output thereof an amplified voltage, Vsig;
    b) providing a signal detector to which Vsig is applied, which detector produces a binary proximity-detector output voltage Vout having transitions of one polarity each time excursions of one polarity in Vsig reach a predetermined point therein;
    c) providing sources of DC off-set-limit voltages $V_A$ and $V_B$ that are respectively more positive and more negative than the center of the dynamic voltage range of said detector; and
    d) when at the output of said amplifier the median voltage, Vos, of Vsig is greater than $V_A$, moving the entire signal Vsig in a negative direction, and when the median value, Vos, of Vsig is less than $V_B$ moving the entire signal Vsig in a positive direction to keep Vos within the range from $V_B$ to $V_A$.

2. The proximity-detection method of claim 1 wherein the steps of moving the entire signal Vsig is accomplished by
    counting the transitions of at least one polarity in Vout during intervals when Vos is greater than $V_A$ and generating a digital signal for adding to Vsig a negative compensating off-set bias voltage by one predetermined negative bias increment at each transition of the one polarity in Vout, and
    counting the transitions of at least one polarity in Vout during intervals when Vos is less than $V_B$ and generating a digital signal for adding to Vsig a positive compensating off-set bias voltage by one predetermined positive bias increment at each transition of the one polarity in Vout.

3. The proximity-detection method of claim 1, wherein said amplifier is a digitally gain-controlled amplifier, the method additionally comprising:
    a) comparing the amplitudes of the excursions of at least one polarity in Vsig to a predetermined target value, $V_{TG}$;
    b) generating a binary signal Vbig that changes from one to another binary level each time that Vsig exceeds the target value;
    c) applying the binary signal Vbig to the digitally-gain-controlled amplifier and when Vbig changes from the one to another binary level changing the gain of the digitally-gain-controlled amplifier by one predetermined gain increment in the direction to bring the peak values in Vsig to just below the predetermined target value.

4. The proximity-detection method of claim 1 wherein said signal detector is of the peak-referenced-threshold signal-detector type, so that the transitions of one polarity in Vout from said signal detector occur at said point in Vsig after each peak excursion of one polarity at which the difference between the peak value and Vsig at said point equals a predetermined threshold value.

5. The proximity-detection method of claim 1 wherein at any given time the median value, Vos, of Vsig at the output of said amplifier is the most recent voltage level centered between the positive and negative peaks of Vsig.

6. The proximity-detection method of claim 1 wherein said signal detector is a peak-referenced-threshold detector that remembers the peaks of at least one polarity until the signal retreats from each peak by a predetermined threshold voltage value that defines said predetermined point in Vsig.

7. The proximity-detection method of claim 1 said median voltage, Vos, is determined by:
    a) continuously generating one reference voltage $V_{P2}$ that is equal to the most recent peak positive going excursion in Vsig;
    b) continuously generating another reference voltage $V_{N2}$ that is equal to the most recent peak negative going excursion in Vsig; and
    c) generating the median voltage, Vos, in the middle of the voltage range between $V_{P2}$ and $V_{N2}$.

* * * * *